United States Patent
Hatabe et al.

(10) Patent No.: US 12,388,035 B2
(45) Date of Patent: Aug. 12, 2025

(54) STRUCTURE COMPRISING UNDER BARRIER METAL AND SOLDER LAYER, AND METHOD FOR PRODUCING STRUCTURE

(71) Applicant: ISHIHARA CHEMICAL CO., LTD., Kobe (JP)

(72) Inventors: Masaru Hatabe, Kobe (JP); Takahiro Tanaka, Kobe (JP); Hironori Yamada, Kobe (JP)

(73) Assignee: ISHIHARA CHEMICAL CO., LTD., Kobe (JP)

( * ) Notice: Subject to any disclaimer, the term of this patent is extended or adjusted under 35 U.S.C. 154(b) by 79 days.

(21) Appl. No.: 18/564,376

(22) PCT Filed: Jun. 15, 2021

(86) PCT No.: PCT/JP2021/022601
§ 371 (c)(1),
(2) Date: Nov. 27, 2023

(87) PCT Pub. No.: WO2022/249500
PCT Pub. Date: Dec. 1, 2022

(65) Prior Publication Data
US 2024/0258255 A1 Aug. 1, 2024

(30) Foreign Application Priority Data
May 27, 2021 (JP) ................. 2021-089587

(51) Int. Cl.
B32B 15/01 (2006.01)
H01L 23/00 (2006.01)

(52) U.S. Cl.
CPC .............. *H01L 24/05* (2013.01); *H01L 24/03* (2013.01); *H01L 24/04* (2013.01); *H01L 24/13* (2013.01);
(Continued)

(58) Field of Classification Search
CPC ................................ C22C 19/07; C22C 38/10
See application file for complete search history.

(56) References Cited

U.S. PATENT DOCUMENTS

| 3,804,726 A | 4/1974 | Passal |
| 9,082,762 B2 | 7/2015 | Kang |

(Continued)

FOREIGN PATENT DOCUMENTS

| DE | 2417952 A1 | 10/1974 |
| EP | 0243627 A1 | 11/1987 |

(Continued)

OTHER PUBLICATIONS

Office Action dated Jun. 28, 2022 received in Japanese Application 2021-089587.
(Continued)

*Primary Examiner* — Adam Krupicka
(74) *Attorney, Agent, or Firm* — Knobbe, Martens, Olson & Bear, LLP

(57) ABSTRACT

A structure including a solder layer has a substrate, a solder layer formed on the substrate, and an under barrier metal formed as an alloy layer containing Fe and Co between the substrate and the solder layer. An internal stress of the under barrier metal is 260 Mpa or less. The structure having an under barrier metal and a solder layer is produced by successively forming on the substrate, the under barrier metal and the solder layer by a plating method.

4 Claims, 1 Drawing Sheet

(52) U.S. Cl.
CPC ..... *H01L 24/11* (2013.01); *H01L 2224/03462* (2013.01); *H01L 2224/0401* (2013.01); *H01L 2224/05157* (2013.01); *H01L 2224/0516* (2013.01); *H01L 2224/05609* (2013.01); *H01L 2224/05611* (2013.01); *H01L 2224/11462* (2013.01); *H01L 2224/13109* (2013.01); *H01L 2224/13111* (2013.01); *H01L 2224/13113* (2013.01); *H01L 2224/13139* (2013.01); *H01L 2224/13147* (2013.01); *H01L 2924/0132* (2013.01); *H01L 2924/014* (2013.01)

(56) References Cited

U.S. PATENT DOCUMENTS

| | | |
|---|---|---|
| 2008/0001288 A1 | 1/2008 | Sogawa |
| 2009/0021109 A1 | 1/2009 | Furukawa |
| 2009/0032942 A1 | 2/2009 | Choi |
| 2018/0112319 A1 | 4/2018 | Imanari |
| 2020/0376808 A1 | 12/2020 | Iuchi |

FOREIGN PATENT DOCUMENTS

| | | | |
|---|---|---|---|
| EP | 0293107 | A2 | 11/1988 |
| JP | S62-199791 | A | 9/1987 |
| JP | S 63-224344 | A | 9/1998 |
| JP | 2006-269458 | A | 10/2006 |
| JP | 2009-524927 | A | 7/2009 |
| JP | 2011-129559 | A | 6/2011 |
| JP | 2016-211046 | A | 12/2016 |
| JP | 2018-070907 | A | 5/2018 |
| JP | 2019-102672 | A | 6/2019 |
| JP | 2019-199651 | A | 11/2019 |
| WO | WO 2006/057360 | A1 | 6/2006 |

OTHER PUBLICATIONS

International Search Report mailed Aug. 31, 2021 in International Application No. PCT/JP2021/022601.
Decision of Registration of corresponding Taiwan Patent Application No. 110126903 issued on Feb. 3, 2025, 6 pages.
EESR dated Feb. 18, 2025, issued for the corresponding EP Patent Application No. 21943134.3, 9 pages.

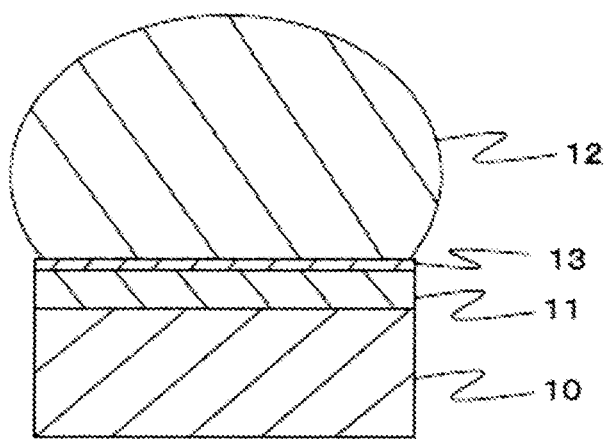

STRUCTURE COMPRISING UNDER BARRIER METAL AND SOLDER LAYER, AND METHOD FOR PRODUCING STRUCTURE

PRIORITY AND CROSS REFERENCE TO RELATED APPLICATIONS

This application is the U.S. National Stage Application under 35 U.S.C. § 371 of International Application No. PCT/JP2021/022601, filed Jun. 15, 2021, designating the U.S. and published as WO 2022/249500 A1 on Dec. 1, 2022, which claims the benefit of Japanese Patent Application No. JP 2021-089587, filed May 27, 2021. Any and all applications for which a foreign or a domestic priority is claimed is/are identified in the Application Data Sheet filed herewith and is/are hereby incorporated by reference in their entirety under 37 C.F.R. § 1.57.

TECHNICAL FIELD

The present invention relates to a structure comprising an under barrier metal and a solder layer, and more particularly, it relates to a structure comprising a solder layer provided as a conductive component or a connection component of an electrode, a wiring or the like of an electronic component or the like.

BACKGROUND ART

Solder materials such as tin (Sn), a Sn alloy, indium (In), and an In alloy that have a low melting point and excellent ductility have been conventionally used as a bonding material in an electronic component and the like. In this case, the solder material is provided on a substrate mainly by a ball mounting method, a pasting method, a plating method, an inkjet method or the like. As the substrate, a copper (Cu) or Cu alloy-based substrate, a nickel (Ni) alloy-based substrate or the like is used, or when another non-metal substrate is used, a Cu layer or a Ni layer is generally formed on the substrate by plating, sputtering or the like. For example, in a flip chip bump or the like, a structure in which a Ni plating layer of about several μm is provided on a Cu sputtered layer used as a substrate, and a plating layer of Sn or a Sn-based alloy is further provided thereon is often used. The Ni plating layer provided on the substrate is usually designated as an under barrier metal (UBM), and one purpose of providing the UBM is to inhibit generation of an intermetallic compound between Cu and the solder material due to metal diffusion.

Even when a UBM of a Ni plating layer is provided, however, a proportion of an intermetallic compound in a connecting portion between a Cu substrate or a Cu sputtered layer provided on a substrate and a solder layer, or between the UBM itself of the Ni plating layer and a solder layer is increased due to recent miniaturization of an electronic circuit, which causes a problem of deterioration of electric characteristics and connection reliability. In order to solve these problems, studies have been made for reducing a generation amount of an intermetallic compound by providing, as a UBM, a cobalt (Co) plating layer or a Ni-iron (Fe) alloy plating layer below a Sn layer or Sn alloy layer (see, for example, Patent Literature 1, Non Patent Literature 1 or the like).

CITATION LIST

Patent Literature

[Patent Literature 1] U.S. Pat. No. 9,082,762
[Patent Literature 2] Japanese Laid-Open Patent Publication No. 2019-102672

Non Patent Literature

[Non Patent Literature 1] Ja-Kyung Koo and Jae-Ho Lee, Materials Transactions, Vol. 58 (2017), No. 2, p. 148-151

SUMMARY OF INVENTION

Technical Problem

In addition to the above prior arts, the present inventors have found that the amount of an intermetallic compound in a connecting portion described in Patent Literature 2 can be reduced by using, as a UBM, Fe alloy plating having a specific composition. It has been found, however, that when internal stress of a FeCo alloy is high, there arise problems that a substrate is broken, the under barrier metal is peeled off from the substrate, or a crack is caused in the under barrier metal itself so as to make it impossible to act as the under barrier metal.

The present invention was devised in consideration of the above-described problems, and an object thereof is to obtain a highly reliable under barrier metal capable of further inhibiting generation of an intermetallic compound between a substrate containing a metal and a solder layer.

Solution to Problem

In order to achieve the object, the present inventors have made earnest studies, and as a result, have found that a highly reliable under barrier metal can be obtained by setting, in a structure including an under barrier metal and a solder layer, internal stress of the under barrier metal to 260 Mpa or less, and thus, the present invention has been accomplished.

Specifically, a structure according to one embodiment of the present invention comprises a substrate; a solder layer formed on the substrate; and an under barrier metal formed as an alloy layer containing Fe and Co between the substrate and the solder layer, in which internal stress of the under barrier metal is 260 Mpa or less.

In the structure according to one embodiment of the present invention, the under barrier metal is formed as an alloy layer containing Fe and Co between the substrate and the solder layer. Therefore, the under barrier metal can inhibit generation of an intermetallic compound otherwise caused through a reaction due to metal diffusion between a metal contained in the substrate and an element, such as Sn, contained in the solder layer. Besides, in the structure of the present invention, the internal stress of the under barrier metal is 260 Mpa or less, and hence, breakage of the substrate, peeling of the under barrier metal off from the substrate, occurrence of a crack in the under barrier metal and the like caused due to the internal stress can be inhibited. As a result, the structure attains favorable electric characteristics, connection reliability and the like, is highly reliable, and is suitably used in an electronic component and the like.

In the structure according to one embodiment of the present invention, the under barrier metal preferably contains Fe in a mass ratio of 10% or more.

In this manner, ability of inhibiting the generation of the intermetallic compound by the under barrier metal can be further improved.

In the structure according to one embodiment of the present invention, the under barrier metal preferably contains Fe in a mass ratio of 10% or more.

In this manner, ability of inhibiting the generation of the intermetallic compound by the under barrier metal can be further improved.

In the structure according to one embodiment of the present invention, a Sn layer or Sn alloy layer, or an In layer or In alloy layer can be applied as the solder layer.

A method for producing a structure according to one embodiment of the present invention is a method for producing a structure including an under barrier metal and a solder layer by successively forming, on a substrate, the under barrier metal and the solder layer by a plating method, comprising a step of forming an under barrier metal having internal stress of 260 Mpa or less by using a plating solution that contains water, at least one iron ion supply source, at least one cobalt ion supply source, at least one acid selected from the group consisting of an inorganic acid, an alkane sulfonic acid, and salts of the acids, and at least one stress relaxation agent, in which the plating solution contains the stress relaxation agent in a concentration of 0.5 g/L to 100 g/L.

When the method for producing a structure according to one embodiment of the present invention is employed, it is possible to obtain an under barrier metal for inhibiting generation of an intermetallic compound otherwise caused through a reaction due to the above-described metal diffusion between a metal contained in the substrate and an element, such as Sn, contained in the solder layer. Besides, since the internal stress of the under barrier metal can be set to 260 Mpa or less, breakage of the substrate, peeling of the under barrier metal off from the substrate, occurrence of a crack in the under barrier metal and the like caused due to the internal stress can be inhibited. Accordingly, when the production method of the present invention is employed, a structure that has favorable electric characteristics, connection reliability and the like, is highly reliable, and is suitably used in an electronic component and the like can be obtained.

Advantageous Effects of Invention

According to a structure of the present disclosure, a highly reliable under barrier metal capable of further inhibiting generation of an intermetallic compound between a substrate containing a metal and a solder layer can be obtained. As a result, the structure has favorable electronic characteristics, connection reliability and the like, is highly reliable, and is suitably used in an electronic component and the like.

BRIEF DESCRIPTION OF THE DRAWING

FIG. 1 is a diagram illustrating a structure according to one embodiment of the present invention.

DETAILED DESCRIPTION

Now, an embodiment for practicing the present invention will be described based on the accompanying drawing. The following preferable embodiment is described substantially as an example, and does not intend to limit the present invention, operation process thereof or use thereof.

A structure according to one embodiment of the present invention will be described with reference to FIG. 1.

As illustrated in FIG. 1, in the structure of the present embodiment, an under barrier metal (UBM) 11 is formed on a substrate 10, and a solder layer 12 is formed on the UBM 11. The substrate 10 is not especially limited, and for example, a metal substrate of Cu, Ni or the like, a glass substrate, a silicon substrate or a sapphire substrate, an organic material substrate and the like can be used. When it is not a metal substrate, however, a metal thin film of Cu or Ni or an alloy containing any of these is formed by plating or sputtering on the top surface thereof, and a structure in the shape of a projection containing Cu or Ni, or an alloy containing any of these is further formed thereon in some cases. Herein, the substrate including such a metal thin film and such a structure formed on the top surface thereof is inclusively designated as the substrate 10. Besides, the substrate 10 is not limited to a plate-shaped substrate, but may be a bar material in the shape of, for example, a bar or a line. The solder layer 12 is made of a single metal of Sn or a Sn alloy containing Sn, or a single metal of In or an In alloy containing In. In particular, examples of the Sn alloy and In alloy include, but are not limited to, Sn—Ag, Sn—Ag—Cu, Sn—Cu, Sn—Bi, Sn—In, and In—Bi. The solder layer 12 is formed by, for example, a ball mounting method, a pasting method, a plating method, or an inkjet method, but the formation method is not limited to these.

When the solder layer 12 is formed as a Sn layer by an electroplating method, a Sn plating solution to be used basically contains a soluble stannous salt, an acid or a salt thereof used as a solution base, and if necessary, various additives such as an antioxidant, a stabilizer, a complexing agent, a surfactant, a brightener, a smoothing agent, a pH adjusting agent, a conductive salt and a preservative. Besides, as the soluble stannous salt, for example, any of stannous salts of organic sulfonic acids such as methanesulfonic acid, ethanesulfonic acid, 2-propanolsulfonic acid, sulfosuccinic acid and p-phenolsulfonic acid, stannous borofluoride, stannous sulfate, stannous oxide, stannous chloride, sodium stannate, potassium stannate and the like can be used. Besides, when the solder layer 12 contains a Sn alloy, a Sn alloy film may be formed by using a plating solution containing, for example, a Sn salt and another metal salt of Ag, Cu or the like, or an alloy film may be formed by laminating a Sn plating film and another metal film of Ag, Cu or the like, and melting the resultant by a heat treatment.

When the solder layer 12 is formed as an In layer by an electroplating method, an In plating solution to be used basically contains a soluble indium salt, an acid or a salt thereof used as a solution base, and if necessary, various additives such as an antioxidant, a stabilizer, a complexing agent, a surfactant, a brightener, a smoothing agent, a pH adjusting agent, a conductive salt and a preservative. Besides, examples of the soluble indium salt include indium sulfamate, indium sulfate, indium borofluoride, indium oxide, indium methanesulfonate, and indium 2-hydroxypropanesulfonate. Alternatively, when the solder layer 12 contains an In alloy, an In alloy film may be formed by using a plating solution containing, for example, an In salt and another metal salt of Sn, bismuth (Bi) or the like, or an alloy film may be formed by laminating an In plating film and another metal film of Sn, Bi or the like, and melting the resultant by a heat treatment.

The antioxidant prevents oxidation of a Sn ion or an In ion in a bath, and for example, hypophosphorous acid or a salt thereof, ascorbic acid or a salt thereof, hydroquinone, catechol, resorcin, fluoroglucin, cresol sulfonic acid or a salt thereof, phenol sulfonic acid or a salt thereof, catechol sulfonic acid or a salt thereof, hydroquinone sulfonic acid or a salt thereof, hydrazine or the like can be used.

The stabilizer stabilizes a plating bath and prevents its decomposition, and for example, any of known stabilizers including a sulfur-containing compound such as a cyanide compound, a thiourea, thiosulfate, sulfite or acetylcysteine, and an oxycarboxylic acid such as citric acid can be used.

The complexing agent is contained for stabilizing a Sn ion or an In ion in a neutral region to prevent generation of white precipitation or decomposition of the bath, and for example, oxycarboxylic acid, polycarboxylic acid, monocarboxylic acid or the like can be used, and specifically, gluconic acid, citric acid, glucoheptonic acid, gluconolactone, glucoheptolactone, formic acid, acetic acid, propionic acid, butyric acid, ascorbic acid, oxalic acid, malonic acid, succinic acid, glycolic acid, malic acid, tartaric acid, diglycolic acid, and salts thereof, and the like can be used. In particular, gluconic acid, citric acid, glucoheptonic acid, gluconolactone, glucoheptolactone, or a salt of any of these is preferred. Besides, ethylenediamine, ethylenediaminetetraacetic acid (EDTA), diethylenetriaminepentaacetic acid (DTPA), nitrilotriacetic acid (NTA), iminodiacetic acid (IDA), iminodipropionic acid (IDP), hydroxyethylethylenediaminetriacetic acid (HEDTA), triethylenetetraminehexaacetic acid (TTHA), ethylene dioxybis(ethylamine)-N,N,N',N'-tetraacetic acid, a glycine, nitrilotrimethylphosphonic acid, 1-hydroxyethane-1,1-diphosphonic acid, or a salt of any of these can be used.

The surfactant makes contribution to improvement of the appearance, the compactness, the smoothness, the adhesiveness and the like of a plating film, and any of usual nonionic, anionic, amphoteric or cationic surfactants can be used. As the anionic surfactant, alkyl sulfate, polyoxyethylene alkyl ether sulfate, polyoxyethylene alkyl phenyl ether sulfate, alkyl benzenesulfonate, alkyl naphthalenesulfonate or the like can be used. Examples of the cationic surfactant include mono-, di- and trialkyl amine salts, dimethyldialkyl ammonium salt and trimethylalkyl ammonium salt. As the nonionic surfactant, those obtained by addition condensation of 2 to 300 mol of ethylene oxide (EO) and/or propylene oxide (PO) with $C_1$ to $C_{20}$ alkanol, phenol, naphthol, a bisphenol, $C_1$ to $C_{25}$ alkylphenol, arylalkylphenol, $C_1$ to $C_{25}$ alkylnaphthol, $C_1$ to $C_{25}$ alkoxy phosphoric acid (salt), sorbitan ester, polyalkylene glycol, $C_1$ to $C_{22}$ fatty amide or the like can be used. As the amphoteric surfactant, carboxybetaine, sulfobetaine, imidazolinebetaine, aminocarboxylic acid or the like can be used.

As the brightener or a semi-brightener, for example, any of various aldehydes such as benzaldehyde, o-chlorobenzaldehyde, 2,4,6-trichlorobenzaldehyde, m-chlorobenzaldehyde, p-nitrobenzaldehyde, p-hydroxybenzaldehyde, furfural, 1-naphthaldehyde, 2-naphthaldehyde, 2-hydroxy-1-naphthaldehyde, 3-acenaphthaldehyde, benzylidene acetone, pyrididene acetone, furfurylidene acetone, cinnamaldehyde, anisaldehyde, salicylaldehyde, crotonaldehyde, acrolein, glutaraldehyde, paraldehyde and vanillin, triazine, imidazole, indole, quinoline, 2-vinylpyridine, aniline, phenanthroline, neocuproine, picolinic acid, thioureas, N-(3-hydroxybutylidene)-p-sulfanilic acid, N-butylidenesulfanilic acid, N-cinnamoylidenesulfanilic acid, 2,4-diamino-6-(2'-methylimidazolyl(1'))ethyl-1,3,5-triazine, 2,4-diamino-6-(2'-ethyl-4-methylimidazolyl(1'))ethyl-1,3,5-triazine, 2,4-diamino-6-(2'-undecylimidazolyl(1'))ethyl-1,3,5-triazine, phenyl salicylate, or any of benzothiazoles such as benzothiazole, 2-methylbenzothiazole, 2-mercaptobenzothiazole, 2-aminobenzothiazole, 2-amino-6-methoxybenzothiazole, 2-methyl-5-chlorobenzothiazole, 2-hydroxybenzothiazole, 2-amino-6-methylbenzothiazole, 2-chlorobenzothiazole, 2,5-dimethylbenzothiazole, and 5-hydroxy-2-methylbenzothiazole can be used.

As the smoothing agent, although some of the following are the same as those described as the examples of the brightener above, β-naphthol, β-naphthol-6-sulfonic acid, β-naphthalenesulfonic acid, m-chlorobenzaldehyde, p-nitrobenzaldehyde, p-hydroxybenzaldehyde, (o- or p-)methoxybenzaldehyde, vanillin, (2,4- or 2,6-)dichlorobenzaldehyde, (o- or p-)chlorobenzaldehyde, 1-naphthaldehyde, 2-naphthaldehyde, 2(4)-hydroxy-1-naphthaladehyde, 2(4)-chloro-1-naphthaldehyde, 2(3)-thiophene carboxaldehyde, 2(3)-furaldehyde, 3-indolecarboxaldehyde, salicylaldehyde, o-phthalaldehyde, formaldehyde, acetaldehyde, paraldehyde, butyraldehyde, isobutyraldehyde, propionaldehyde, n-valeraldehyde, acrolein, crotonaldehyde, glyoxal, aldol, succindialdehyde, capronaldehyde, isovaleraldehyde, allyl aldehyde, glutaraldehyde, 1-benzylidene-7-heptanal, 2,4-hexadienal, cinnamaldehyde, benzyl crotonaldehyde, an amine-aldehyde condensate, mesityl oxide, isophorone, diacetyl, hexandion-3,4, acetylacetone, 3-chlorobenzylideneacetone, sub. pyridylidene acetone, sub. furfurylidine acetone, sub. tenylidene acetone, 4-(1-naphthyl)-3-buten-2-one, 4-(2-furyl)-3-buten-2-one, 4-(2-thiophenyl)-3-buten-2-one, curcumin, benzylidene acetylacetone, benzalacetone, acetophenone, (2,4- or 3,4-)dichloroacetophenone, benzylidene acetophenone, 2-cinnamylthiophene, 2-(ω-benzoyl)vinylfuran, vinyl phenyl ketone, acrylic acid, methacrylic acid, ethacrylic acid, ethyl acrylate, methyl methacrylate, butyl methacrylate, crotonic acid, propylene-1,3-dicarboxylic acid, cinnamic acid, (o-, m-, or p-)toluidine, (o- or p-)aminoaniline, aniline, (o- or p-)chloroaniline, (2,5- or 3,4-)chloromethyl aniline, N-monomethyl aniline, 4,4'-diaminodiphenylmethane, N-phenyl-(α- or β-)naphthylamine, methylbenzotriazole, 1,2,3-triazine, 1,2,4-triazine, 1,3,5-triazine, 1,2,3-benzotriazine, imidazole, 2-vinylpyridine, indole, quinoline, a reaction product of monoethanolamine and o-vanillin, polyvinyl alcohol, catechol, hydroquinone, resorcin, polyethyleneimine, disodium ethylenediaminetetraacetate, and polyvinyl pyrrolidone can be used. Besides, gelatin, polypeptone, N-(3-hydroxybutylidene)-p-sulfanilic acid, N-butylidenesulfanilic acid, N-cinnamoylidenesulfanilic acid, 2,4-diamino-6-(2'-methylimidazolyl(1'))ethyl-1,3,5-triazine, 2,4-diamino-6-(2'-ethyl-4-methylimidazolyl(1'))ethyl-1,3,5-triazine, 2,4-diamino-6-(2'-undecylimidazolyl(1'))ethyl-1,3,5-triazine, phenyl salicylate, and benzothiazoles are effectively used as the smoothing agent. As the benzothiazoles, benzothiazole, 2-methylbenzothiazole, 2-mercaptobenzothiazole, 2-(methylmercapto)benzothiazole, 2-aminobenzothiazole, 2-amino-6-methoxybenzothiazole, 2-methyl-5-chlorobenzothiazole, 2-hydroxybenzothiazole, 2-amino-6-methylbenzothiazole, 2-chlorobenzothiazole, 2,5-dimethylbenzothiazole, 6-nitro-2-mercaptobenzothiazole, 5-hydroxy-2-methylbenzothiazole, and 2-benzothiazole thioacetic acid can be used.

As the pH adjusting agent, any of various acids such as hydrochloric acid and sulfuric acid, and various bases such as ammonia water, potassium hydroxide and sodium hydroxide can be used, and besides, monocarboxylic acids such as formic acid, acetic acid and propionic acid, boric acids, phosphoric acids, dicarboxylic acids such as oxalic acid and succinic acid, and oxycarboxylic acids such as lactic acid and tartaric acid can be used.

As the conductive salt, any of sodium salts, potassium salts, magnesium salts, ammonium salts, amine salts and the like of sulfuric acid, hydrochloric acid, phosphoric acid, sulfamic acid, sulfonic acid and the like can be used, and it is noted that the above-described pH adjusting agent can be used also as the conductive salt in some cases.

As the preservative, boric acid, 5-chloro-2-methyl-4-isothiazolin-3-one, benzalkonium chloride, phenol, phenol polyethoxylate, thymol, resorcin, isopropylamine, guaiacol and the like can be used.

The UBM 11 is provided for inhibiting formation of an intermetallic compound 13 through a reaction caused due to metal diffusion of a metal contained in the substrate 10 between the metal and Sn or In contained in the solder layer 12. The UBM 11 is an alloy layer containing Fe and Co, and preferably contains Fe in a mass ratio of 10% or more. Owing to such a constitution, the effect of inhibiting the generation of the intermetallic compound 13 by the UBM 11 can be improved.

The UBM 11 can be formed by a method of, for example, plating, sputtering, deposition, ball mounting, paste printing or the like. For example, when the UBM 11 is formed by electroplating, a solution containing at least one of water-soluble Co salt, Rh salt, Fe salt, Rh salt and Pd salt dissolved therein, and appropriately containing an acid or a salt thereof as a solution base, and if necessary, any of the above-described various additives such as the antioxidant, the stabilizer, the complexing agent, the surfactant, the brightener, the smoothing agent, the pH adjusting agent, the conductive salt and the preservative can be used as a plating solution.

In the structure of the present embodiment employing the UBM 11 having the above-described composition, although the intermetallic compound 13 is generated as illustrated in FIG. 1, the thickness can be extremely reduced as compared with that in a conventional structure.

If the UBM 11 of the alloy layer containing Fe and Co has high internal stress, the substrate may be broken, the under barrier metal may be peeled off from the substrate, or a crack may be caused in the under barrier metal itself to make it impossible to act as the under barrier metal in some cases. Therefore, in the present embodiment, the UBM 11 is formed to have internal stress thereof of 260 Mpa or less. Thus, the breakage of the substrate 11, the peeling of the UBM 11 off from the substrate 10, occurrence of a crack in the UBM 11 and the like caused due to the internal stress of the UBM 11 can be inhibited.

In order to form such a UBM 11, a plating solution containing, for example, water, at least one iron ion supply source, at least one cobalt ion supply source, at least one acid selected from the group consisting of an inorganic acid, an alkane sulfonic acid, and salts of these acids, and at least one stress relaxation agent can be used.

The iron ion supply source contained in the plating solution is not especially limited, and examples include salts of iron chloride, iron sulfate, iron nitrate, iron sulfamate, iron acetate, iron bromide, iron sulfide, iron citrate, ferric ammonium citrate, ferric ammonium sulfate, iron lactate, iron oxalate, iron phosphate, iron pyrophosphate, and the like, and hydrates thereof. One of these can be singly used, or two or more of these can be simultaneously used.

The cobalt ion supply source contained in the plating solution is not especially limited, and examples include salts of cobalt sulfate, cobalt chloride, cobalt acetate, cobalt borofluoride, cobalt methanesulfonate, cobalt 2-hydroxypropanesulfonate, cobalt sulfamate, and the like, and hydrates thereof. One of these can be singly used, or two or more of these can be simultaneously used.

Examples of the acid contained in the plating solution include acids and salts of hydrochloric acid, sulfuric acid, nitric acid, sulfamic acid, acetic acid, citric acid, lactic acid, oxalic acid, phosphoric acid, pyrophosphoric acid, and the like. One of these can be singly used, or two or more of these can be simultaneously used.

Examples of the stress relaxation agent contained in the plating solution include saccharin sodium, gluconic acid, nitrilotriacetic acid, ethylenediaminetetraacetic acid, diethylenetriaminepentaacetic acid, 2-hydroxyethylethylenediaminetriacetic acid, triethylenetetraminehexaacetic acid, 1,3-propanediaminetetraacetic acid, diaminohydroxypropanetetraacetic acid, 2-hydroxyethyliminodiacetic acid, glycol ether diaminetetraacetic acid, ethylenediamine-N,N'-disuccinic acid, maleic acid, methanesulfonic acid, ethanesulfonic acid, 2-propanolsulfonic acid, sulfosuccinic acid, p-phenolsulfonic acid, formic acid, tartaric acid, glyoxylic acid, phosphorus acid, hypophosphoric acid, boric acid, 1-naphthol-4-sulfonic acid, thiodiglycolic acid, methacrylic acid, acrylic acid, and picolinic acid. One of these can be singly used, or two or more of these can be simultaneously used. The stress relaxation agent is adjusted to obtain internal stress of the UBM 11 of 260 Mpa or less and contained in the plating solution. In order to attain the internal stress, specifically, the stress relaxation agent is added to the plating solution in a concentration of 0.5 g/L to 100 g/L, and preferably 1 g/L to 40 g/L.

The structure of the present embodiment is applicable to electronic components such as a printed wiring board, a semiconductor integrated circuit, a resistor, a capacitor, a filter, a thermistor, a crystal oscillator, a switch, a lead wire and a solar cell, but the application is not limited to these.

EXAMPLES

Examples will now be described for describing, in detail, the structure according to the present invention.

In these examples, thicknesses of intermetallic compounds generated in structures including the UBM of the present invention (Examples 1 to 22), and structures including a conventional UBM different from the present UBM (Comparative Examples 1 to 13), and internal stress of the UBMs were measured, and the UBMs were observed whether or not being peeled off from substrates for comparison. Compositions of plating solutions for the UBMs and plating conditions employed in Comparative Examples 1 to 13 and Examples 1 to 22 were as follows:

(1) Comparative Example 1

An electrolytic Ni bath having the following composition was prepared. Besides, plating conditions were as follows:

[Composition]

nickel sulfamate (in terms of $Ni^{2+}$): 50 g/L boric acid: 40 g/L saccharin sodium: 2 g/L pH 4.0

[Plating Conditions]

(i) bath temperature: 50° ° C.

(ii) cathode current density first cathode current density: 3 A/dm² plating time: about 300 sec thickness of formed plating layer: 3 μm

(2) Comparative Example 2

An electrolytic Ni bath having the following composition was prepared. Besides, plating conditions were as follows:
[Composition]
  nickel sulfamate (in terms of $Ni^{2+}$): 50 g/L
  boric acid: 40 g/L
  saccharin sodium: 1 g/L
  pH 4.0
[Plating Conditions]
  (i) bath temperature: 50° ° C.
  (ii) cathode current density
  first cathode current density: 3 $A/dm^2$
  plating time: about 300 sec
  thickness of formed plating layer: 3 μm

(3) Comparative Example 3

An electrolytic Ni bath having the following composition was prepared. Besides, plating conditions were as follows:
[Composition]
  nickel sulfamate (in terms of $Ni^{2+}$): 50 g/L
  boric acid: 40 g/L
  saccharin sodium: 0.70 g/L
  pH 4.0
[Plating Conditions]
  (i) bath temperature: 50° ° C.
  (ii) cathode current density
  first cathode current density: 3 $A/dm^2$
  plating time: about 300 sec
  thickness of formed plating layer: 3 μm

(4) Comparative Example 4

An electrolytic Ni bath having the following composition was prepared. Besides, plating conditions were as follows:
[Composition]
  nickel sulfamate (in terms of $Ni^{2+}$): 50 g/L
  boric acid: 40 g/L
  saccharin sodium: 0.50 g/L
  pH 4.0
[Plating Conditions]
  (i) bath temperature: 50° C.
  (ii) cathode current density
  first cathode current density: 3 $A/dm^2$
  plating time: about 300 sec
  thickness of formed plating layer: 3 μm

(5) Comparative Example 5

An electrolytic Ni bath having the following composition was prepared. Besides, plating conditions were as follows:
[Composition]
  nickel sulfamate (in terms of $Ni^{2+}$): 50 g/L
  boric acid: 40 g/L
  saccharin sodium: 0.20 g/L
  pH 4.0
[Plating Conditions]
  (i) bath temperature: 50° ° C.
  (ii) cathode current density
  first cathode current density: 3 $A/dm^2$
  plating time: about 300 sec
  thickness of formed plating layer: 3 μm

(6) Comparative Example 6

An electrolytic Fe—Co bath having the following composition was prepared. Besides, plating conditions were as follows:
[Composition]
  iron chloride (in terms of $Fe^{2+}$): 20 g/L
  cobalt chloride (in terms of $Co^{2+}$): 80 g/L
  citric acid: 20 g/L
  pH 3.5
[Plating Conditions]
  (i) bath temperature: 50° C.
  (ii) cathode current density
  first cathode current density: 3 $A/dm^2$
  plating time: about 300 sec
  thickness of formed plating layer: 3 μm

(7) Comparative Example 7

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 50 g/L
  citric acid: 20 g/L
  pH 3.5
[Plating Conditions]
  (i) bath temperature: 50° C.
  (ii) cathode current density
  first cathode current density: 3 $A/dm^2$
  plating time: about 300 sec
  thickness of formed plating layer: 3 μm

(8) Comparative Example 8

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 20 g/L
  citric acid: 20 g/L
  pH 3.5
[Plating Conditions]
  (i) bath temperature: 50° ° C.
  (ii) cathode current density
  first cathode current density: 3 $A/dm^2$
  plating time: about 300 sec
  thickness of formed plating layer: 3 μm

(9) Comparative Example 9

An electrolytic Fe—Co bath having the following composition was prepared. Besides, plating conditions were as follows:
[Composition]
  iron chloride (in terms of $Fe^{2+}$): 100 g/L
  cobalt chloride (in terms of $Co^{2+}$): 20 g/L
  citric acid: 20 g/L
  pH 3.5
[Plating Conditions]
  (i) bath temperature: 50° ° C.
  (ii) cathode current density
  first cathode current density: 3 $A/dm^2$
  plating time: about 300 sec
  thickness of formed plating layer: 3 μm

(10) Comparative Example 10

An electrolytic Fe—Co bath having the following composition was prepared. Besides, plating conditions were as follows:

[Composition]
  iron chloride (in terms of $Fe^{2+}$): 45 g/L
  cobalt chloride (in terms of $Co^{2+}$): 45 g/L
  citric acid: 20 g/L
  pH 3.5
[Plating Conditions]
  (i) bath temperature: 50° C.
  (ii) cathode current density
  first cathode current density: 3 A/dm$^2$
  plating time: about 300 sec
  thickness of formed plating layer: 3 μm

(11) Comparative Example 11

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 10 g/L
  citric acid: 20 g/L
  pH 3.5
[Plating Conditions]
  (i) bath temperature: 50° C.
  (ii) cathode current density
  first cathode current density: 3 A/dm$^2$
  plating time: about 300 sec
  thickness of formed plating layer: 3 μm

(12) Comparative Example 12

An electrolytic Fe—Co bath having the following composition was prepared. Besides, plating conditions were as follows:
[Composition]
  iron chloride (in terms of $Fe^{2+}$): 110 g/L
  cobalt chloride (in terms of $Co^{2+}$): 20 g/L
  citric acid: 20 g/L
  pH 3.5
[Plating Conditions]
  (i) bath temperature: 50° C.
  (ii) cathode current density
  first cathode current density: 3 A/dm$^2$
  plating time: about 300 sec
  thickness of formed plating layer: 3 μm

(13) Comparative Example 13

An electrolytic Fe—Co bath having the following composition was prepared. Besides, plating conditions were as follows:
[Composition]
  iron chloride (in terms of $Fe^{2+}$): 90 g/L
  cobalt chloride (in terms of $Co^{2+}$): 20 g/L
  citric acid: 20 g/L
  pH 3.5
[Plating Conditions]
  (i) bath temperature: 50° C.
  (ii) cathode current density
  first cathode current density: 3 A/dm$^2$
  plating time: about 300 sec
  thickness of formed plating layer: 3 μm

(14) Example 1

An electrolytic Fe—Co bath having the following composition was prepared. Besides, plating conditions were as follows:
[Composition]
  iron chloride (in terms of $Fe^{2+}$): 20 g/L
  cobalt chloride (in terms of $Co^{2+}$): 80 g/L
  citric acid: 20 g/L
  nitrilotriacetic acid: 10 g/L
  pH 3.5
[Plating Conditions]
  (i) bath temperature: 50° C.
  (ii) cathode current density
  first cathode current density: 3 A/dm$^2$
  plating time: about 300 sec
  thickness of formed plating layer: 3 μm

(15) Example 2

An electrolytic Fe—Co bath having the following composition was prepared. Besides, plating conditions were as follows:
[Composition]
  iron chloride (in terms of $Fe^{2+}$): 30 g/L
  cobalt chloride (in terms of $Co^{2+}$): 65 g/L
  citric acid: 20 g/L
  2-hydroxyethylethylenediaminetriacetic acid: 20 g/L
  pH 3.5
[Plating Conditions]
  (i) bath temperature: 50° C.
  (ii) cathode current density
  first cathode current density: 3 A/dm$^2$
  plating time: about 300 sec
  thickness of formed plating layer: 3 μm

(16) Example 3

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 50 g/L
  citric acid: 20 g/L
  nitrilotriacetic acid: 10 g/L
  pH 3.5
[Plating Conditions]
  (i) bath temperature: 50° C.
  (ii) cathode current density
  first cathode current density: 3 A/dm$^2$
  plating time: about 300 sec
  thickness of formed plating layer: 3 μm

(17) Example 4

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 50 g/L
  citric acid: 20 g/L
  ethylenediaminetetraacetic acid: 10 g/L
  pH 3.5
[Plating Conditions]
  (i) bath temperature: 50° C.
  (ii) cathode current density
  first cathode current density: 3 A/dm$^2$
  plating time: about 300 sec
  thickness of formed plating layer: 3 μm

(18) Example 5

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 10 g/L
  citric acid: 20 g/L
  ethylenediaminetetraacetic acid: 10 g/L
  pH 3.5
[Plating Conditions]
  (i) bath temperature: 50° ° C.
  (ii) cathode current density
  first cathode current density: 3 A/dm²
  plating time: about 300 sec
  thickness of formed plating layer: 3 μm

(19) Example 6

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 20 g/L
  citric acid: 20 g/L
  1-naphthol-4-sulfonic acid: 10 g/L
  pH 3.5
[Plating Conditions]
  (i) bath temperature: 50° ° C.
  (ii) cathode current density
  first cathode current density: 3 A/dm²
  plating time: about 300 sec
  thickness of formed plating layer: 3 μm

(20) Example 7

An electrolytic Fe—Co bath having the following composition was prepared. Besides, plating conditions were as follows:
[Composition]
  iron chloride (in terms of $Fe^{2+}$): 90 g/L
  cobalt chloride (in terms of $Co^{2+}$): 20 g/L
  citric acid: 20 g/L
  methacrylic acid: 10 g/L
  pH 3.5
[Plating Conditions]
  (i) bath temperature: 50° ° C.
  (ii) cathode current density
  first cathode current density: 3 A/dm²
  plating time: about 300 sec
  thickness of formed plating layer: 3 μm

(21) Example 8

An electrolytic Fe—Co bath having the following composition was prepared. Besides, plating conditions were as follows:
[Composition]
  iron chloride (in terms of $Fe^{2+}$): 100 g/L
  cobalt chloride (in terms of $Co^{2+}$): 20 g/L
  citric acid: 20 g/L
  triethylenetetraminehexaacetic acid: 10 g/L
  pH 3.5
[Plating Conditions]
  (i) bath temperature: 50° ° C.
  (ii) cathode current density
  first cathode current density: 3 A/dm²
  plating time: about 300 sec
  thickness of formed plating layer: 3 μm

(22) Example 9

An electrolytic Fe—Co bath having the following composition was prepared. Besides, plating conditions were as follows:
[Composition]
  iron chloride (in terms of $Fe^{2+}$): 110 g/L
  cobalt chloride (in terms of $Co^{2+}$): 20 g/L
  citric acid: 20 g/L
  glycol ether diaminetetraacetic acid: 10 g/L
  pH 3.5
[Plating Conditions]
  (i) bath temperature: 50° ° C.
  (ii) cathode current density
  first cathode current density: 3 A/dm²
  plating time: about 300 sec
  thickness of formed plating layer: 3 μm

(23) Example 10

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 50 g/L
  citric acid: 20 g/L
  boric acid: 10 g/L
  pH 3.5
[Plating Conditions]
  (i) bath temperature: 50° ° C.
  (ii) cathode current density
  first cathode current density: 3 A/dm²
  plating time: about 300 sec
  thickness of formed plating layer: 3 μm

(24) Example 11

An electrolytic Fe—Co bath having the following composition was prepared. Besides, plating conditions were as follows:
[Composition]
  iron chloride (in terms of $Fe^{2+}$): 90 g/L
  cobalt chloride (in terms of $Co^{2+}$): 20 g/L
  citric acid: 20 g/L
  glyoxylic acid: 10 g/L
  pH 3.5
[Plating Conditions]
  (i) bath temperature: 50° ° C.
  (ii) cathode current density
  first cathode current density: 3 A/dm²
  plating time: about 300 sec
  thickness of formed plating layer: 3 μm

(25) Example 12

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 50 g/L
  citric acid: 20 g/L
  malic acid: 10 g/L
  pH 3.5
[Plating Conditions]
  (i) bath temperature: 50° ° C.
  (ii) cathode current density
  first cathode current density: 3 A/dm$^2$
  plating time: about 300 sec
  thickness of formed plating layer: 3 μm

(26) Example 13

An electrolytic Fe—Co bath having the following composition was prepared. Besides, plating conditions were as follows:
[Composition]
  iron chloride (in terms of $Fe^{2+}$): 90 g/L
  cobalt chloride (in terms of $Co^{2+}$): 20 g/L
  citric acid: 20 g/L
  ethanesulfonic acid: 10 g/L
  pH 3.5
[Plating Conditions]
  (i) bath temperature: 50° ° C.
  (ii) cathode current density
  first cathode current density: 3 A/dm$^2$
  plating time: about 300 sec
  thickness of formed plating layer: 3 μm

(27) Example 14

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 50 g/L
  citric acid: 20 g/L
  sodium gluconate: 10 g/L
  pH 3.5
[Plating Conditions]
  (i) bath temperature: 50° ° C.
  (ii) cathode current density
  first cathode current density: 3 A/dm$^2$
  plating time: about 300 sec
  thickness of formed plating layer: 3 μm

(28) Example 15

An electrolytic Fe—Co bath having the following composition was prepared. Besides, plating conditions were as follows:
[Composition]
  iron chloride (in terms of $Fe^{2+}$): 100 g/L
  cobalt chloride (in terms of $Co^{2+}$): 20 g/L
  citric acid: 20 g/L
  acrylic acid: 10 g/L
  pH 3.5
[Plating Conditions]
  (i) bath temperature: 50° ° C.
  (ii) cathode current density
  first cathode current density: 3 A/dm$^2$
  plating time: about 300 sec
  thickness of formed plating layer: 3 μm

(29) Example 16

An electrolytic Fe—Co bath having the following composition was prepared. Besides, plating conditions were as follows:
[Composition]
  iron chloride (in terms of $Fe^{2+}$): 90 g/L
  cobalt chloride (in terms of $Co^{2+}$): 20 g/L
  citric acid: 20 g/L
  tartaric acid: 10 g/L
  pH 3.5
[Plating Conditions]
  (i) bath temperature: 50° C.
  (ii) cathode current density
  first cathode current density: 3 A/dm$^2$
  plating time: about 300 sec
  thickness of formed plating layer: 3 μm

(30) Example 17

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 50 g/L
  citric acid: 20 g/L
  pyrophosphoric acid: 10 g/L
  pH 3.5
[Plating Conditions]
  (i) bath temperature: 50° ° C.
  (ii) cathode current density
  first cathode current density: 3 A/dm$^2$
  plating time: about 300 sec
  thickness of formed plating layer: 3 μm

(31) Example 18

An electrolytic Fe—Co bath having the following composition was prepared. Besides, plating conditions were as follows:
[Composition]
  iron chloride (in terms of $Fe^{2+}$): 90 g/L
  cobalt chloride (in terms of $Co^{2+}$): 20 g/L
  citric acid: 20 g/L
  ethylenediamine-N,N'-disuccinic acid: 10 g/L
  pH 3.5
[Plating Conditions]
  (i) bath temperature: 50° ° C.
  (ii) cathode current density
  first cathode current density: 3 A/dm$^2$
  plating time: about 300 sec
  thickness of formed plating layer: 3 μm

(32) Example 19

An electrolytic Fe—Co bath having the following composition was prepared. Besides, plating conditions were as follows:
[Composition]
  iron chloride (in terms of $Fe^{2+}$): 40 g/L
  cobalt chloride (in terms of $Co^{2+}$): 50 g/L citric acid: 20 g/L
thiodiglycolic acid: 10 g/L
pH 3.5
[Plating Conditions]
 (i) bath temperature: 50° ° C.
 (ii) cathode current density
 first cathode current density: 3 A/dm²
 plating time: about 300 sec
 thickness of formed plating layer: 3 μm

(33) Example 20

An electrolytic Fe—Co bath having the following composition was prepared. Besides, plating conditions were as follows:
[Composition]
 iron chloride (in terms of Fe²⁺): 90 g/L
 cobalt chloride (in terms of Co²⁺): 20 g/L
 citric acid: 20 g/L
 sulfosuccinic acid: 10 g/L
 pH 3.5
[Plating Conditions]
 (i) bath temperature: 50° ° C.
 (ii) cathode current density
 first cathode current density: 3 A/dm²
 plating time: about 300 sec
 thickness of formed plating layer: 3 μm

(34) Example 21

An electrolytic Fe—Co bath having the following composition was prepared. Besides, plating conditions were as follows:
[Composition]
 iron chloride (in terms of Fe²⁺): 40 g/L
 cobalt chloride (in terms of Co²⁺): 50 g/L
 citric acid: 20 g/L
 thiodiglycolic acid: 10 g/L
 pH 3.5
[Plating Conditions]
 (i) bath temperature: 50° ° C.
 (ii) cathode current density
 first cathode current density: 3 A/dm²
 plating time: about 300 sec
 thickness of formed plating layer: 3 μm

(35) Example 22

An electrolytic Fe—Co bath having the following composition was prepared. Besides, plating conditions were as follows:
[Composition]
 iron sulfamate (in terms of Fe²⁺): 40 g/L
 cobalt sulfamate (in terms of Co²⁺): 50 g/L
 citric acid: 20 g/L
 sulfosuccinic acid: 10 g/L
 pH 3.5

[Plating Conditions]
 (i) bath temperature: 50° ° C.
 (ii) cathode current density
 first cathode current density: 3 A/dm²
 plating time: about 300 sec
 thickness of formed plating layer: 3 μm In each of Examples 1 to 22 and Comparative Examples 1 to 13, a copper layer was formed on a top surface of a semiconductor wafer to obtain a substrate, and a UBM was formed on the substrate by the above-described method. Besides, a solder layer was formed on the UBM by electroplating to complete a structure. The electroplating for forming the solder layer was performed by a usual known method, and a plating solution in which any one or more of a water-soluble Sn salt, In salt, Ag salt, Bi salt, and Cu salt were dissolved in accordance with the type of a plating film to be formed, and any of various additives were contained was used. Besides, plating conditions of 30° C. and 3 A/dm² were employed, and a thickness of the plating film was 10 μm.

Each of the structures of Examples 1 to 22 and Comparative Examples 1 to 13 formed as described above was subjected to a heat treatment at 180° C. for 150 hours, and thereafter, a thickness of an intermetallic compound generated under the solder layer, that is, the Sn layer or Sn alloy layer, or the In layer or In alloy layer, was measured, and the results are shown in Table 1. It is noted that the thickness of the intermetallic compound is shown as a ratio calculated with the result of Comparative Example 1 used as a reference (100%). Table 1 also shows, in addition to the results, the compositions of the UBM and the solder layer formed in each of the examples and comparative examples, the internal stress of the UBM, and whether or not the UBM was peeled off from the substrate. Each numerical value shown in each column of "UBM" in Table 1 indicates a mass ratio, and for example, "Fe10-Co90" means an alloy containing 10% by mass of Fe and 90% by mass of Co. Besides, in each column of "Solder Layer", a content ratio of one metal used in the alloy is shown in parentheses, and a balance corresponds to a content ratio of the other metal. Besides, the internal stress of each UBM was calculated in accordance with the following equation with a spread width between strip legs measured with a strip type electrodeposition stress tester (683EC analyzer, manufactured by Fuji Kasei Co., Ltd.).

$$S = UKM/3T$$

In the equation, S indicates the internal stress, U indicates the spread width between strip legs, K indicates a calibration constant of a test strip, M indicates M factor (elastic modulus of deposit/elastic modulus of test strip material), and T indicates a thickness of the deposit.

TABLE 1

| | UBM | Solder Layer | Thickness of Intermetallic Compound (%) | Internal Stress (MPa) | Peeling |
|---|---|---|---|---|---|
| Com. Ex. 1 | Ni | Sn—Ag(Ag2.5 wt %) | 100.0% | −16.4 | not peeled |
| Com. Ex. 2 | Ni | Sn—Ag(Ag2.5 wt %) | 99.8% | 48.9 | not peeled |
| Com. Ex. 3 | Ni | Sn—Ag(Ag2.5 wt %) | 97.1% | 119.2 | not peeled |
| Com. Ex. 4 | Ni | Sn—Ag(Ag2.5 wt %) | 98.9% | 253.3 | not peeled |
| Com. Ex. 5 | Ni | Sn—Ag(Ag2.5 wt %) | 99.2% | 327.8 | peeled |

TABLE 1-continued

| | UBM | Solder Layer | Thickness of Intermetallic Compound (%) | Internal Stress (MPa) | Peeling |
|---|---|---|---|---|---|
| Com. Ex. 6 | Fe10—Co90 | Sn—Ag(Ag2.5 wt %) | 31.4% | 301.4 | peeled |
| Com. Ex. 7 | Fe30—Co70 | Sn—Ag(Ag2.5 wt %) | 28.6% | 298.6 | peeled |
| Com. Ex. 8 | Fe60—Co40 | Sn—Ag(Ag2.5 wt %) | 19.7% | 289.7 | peeled |
| Com. Ex. 9 | Fe80—Co20 | Sn—Ag(Ag2.5 wt %) | 10.0% | 288.5 | peeled |
| Com. Ex. 10 | Fe35—Co65 | Sn | 21.2% | 291.2 | peeled |
| Com. Ex. 11 | Fe50—Co50 | In | 29.3% | 299.3 | peeled |
| Com. Ex. 12 | Fe85—Co15 | In—Sn(Sn35 wt %) | 18.5% | 288.5 | peeled |
| Com. Ex. 13 | Fe70—Co30 | Sn—Bi(Bi57 wt %) | 25.6% | 295.6 | peeled |
| Example 1 | Fe10—Co90 | Sn—Ag(Ag2.5 wt %) | 34.6% | −59.7 | not peeled |
| Example 2 | Fe20—Co80 | Sn—Ag(Ag2.5 wt %) | 32.9% | 237 | not peeled |
| Example 3 | Fe30—Co70 | Sn—Ag(Ag2.5 wt %) | 28.7% | −48.2 | not peeled |
| Example 4 | Fe40—Co60 | Sn—Ag(Ag2.5 wt %) | 27.5% | 40.8 | not peeled |
| Example 5 | Fe50—Co50 | Sn—Ag(Ag2.5 wt %) | 26.9% | 34.1 | not peeled |
| Example 6 | Fe60—Co40 | Sn—Ag(Ag2.5 wt %) | 24.6% | 89.8 | not peeled |
| Example 7 | Fe70—Co30 | Sn—Ag(Ag2.5 wt %) | 23.4% | 153.8 | not peeled |
| Example 8 | Fe80—Co20 | Sn—Ag(Ag2.5 wt %) | 21.0% | 257.1 | not peeled |
| Example 9 | Fe90—Co10 | Sn—Ag(Ag2.5 wt %) | 21.8% | 131.8 | not peeled |
| Example 10 | Fe40—Co60 | Sn | 25.7% | 28.2 | not peeled |
| Example 11 | Fe70—Co30 | Sn | 22.7% | 130.2 | not peeled |
| Example 12 | Fe40—Co60 | In | 26.6% | 55.2 | not peeled |
| Example 13 | Fe70—Co30 | In | 23.1% | 133.9 | not peeled |
| Example 14 | Fe30—Co70 | In—Sn(Sn35 wt %) | 24.4% | 8.2 | not peeled |
| Example 15 | Fe80—Co20 | In—Sn(Sn35 wt %) | 20.4% | 118.5 | not peeled |
| Example 16 | Fe70—Co30 | Sn—Cu(Cu0.7 wt %) | 24.6% | 124.5 | not peeled |
| Example 17 | Fe30—Co70 | Sn—Bi(Bi57 wt %) | 22.3% | 70.8 | not peeled |
| Example 18 | Fe70—Co30 | Sn—Bi(Bi40 wt %) | 25.8% | 135.6 | not peeled |
| Example 19 | Fe40—Co60 | In—Bi(Bi15 wt %) | 24.1% | 140 | not peeled |
| Example 20 | Fe70—Co30 | In—Bi(Bi15 wt %) | 23.9% | 141.2 | not peeled |
| Example 21 | Fe40—Co60 | Sn | 23.6% | 101.9 | not peeled |
| Example 22 | Fe40—Co60 | Sn—Ag(Ag2.5 wt %) | 25.9% | 94.2 | not peeled |

It is understood, as shown in Table 1, that the formation of an intermetallic compound between the UBM and the solder layer can be inhibited in Comparative Examples 6 to 13 and Examples 1 to 22 using FeCo alloys as the UBM as compared with in Comparative Examples 1 to 5 using Ni as the UBM. Besides, it is understood, based on the results of Comparative Examples 1 to 13, that the UBM is peeled off from the substrate if the internal stress is high no matter whether the UBM is Ni or a FeCo alloy. In this regard, it is deemed that the composition of Fe and Co in the UBM does not affect whether or not it is peeled. Besides, peeling is caused regardless of the type of a Sn layer or Sn alloy layer, or an In layer or In alloy layer to be plated on the UBM. It has been confirmed, through comparison among Comparative Examples 6 to 13 and Examples 1 to 22, that the internal stress of the UBM is reduced by adding a stress relaxation agent, and hence peeling is not caused. The peeling of the UBM can be prevented regardless of the type of the solder layer to be plated on the UBM. In Examples 1 to 22, the UBM is not peeled off from the substrate, and the formation of an intermetallic compound between the UBM and the solder layer is inhibited as described above, and thus, it is deemed that the UBMs of Examples 1 to 22 have excellent characteristics as compared with the UBMs of Comparative Examples 1 to 13.

As described so far, in a structure of the present invention, a highly reliable UBM capable of further inhibiting generation of an intermetallic compound between a substrate containing a metal and a solder layer, and therefore, the structure has favorable electric characteristics, connection reliability and the like, is highly reliable, and is suitably used in an electronic component and the like.

DESCRIPTION OF REFERENCE CHARACTERS

10 Substrate
11 Under barrier metal (UBM)
12 Solder layer
13 Intermetallic compound

What is claimed is:

1. A structure, comprising:
   a substrate;
   a solder layer formed on the substrate; and
   an under barrier metal formed as an alloy layer containing Fe and Co between the substrate and the solder layer, wherein internal stress of the under barrier metal is 260 Mpa or less.

2. The structure according to claim 1, wherein the under barrier metal contains Fe in a mass ratio of 10% or more.

3. The structure according to claim 1, wherein the solder layer is a Sn layer or Sn alloy layer, or an In layer or In alloy layer.

4. A method for producing a structure comprising an under barrier metal and a solder layer by successively forming on a substrate, the under barrier metal and the solder layer by a plating method, the method comprising:
   forming an under barrier metal having internal stress of 260 Mpa or less by using a plating solution that contains water, at least one iron ion supply source, at least one cobalt ion supply source, at least one acid selected from the group consisting of an inorganic acid, an alkane sulfonic acid, and salts of the acids, and at least one stress relaxation agent,
   wherein the plating solution contains the stress relaxation agent in a concentration of 0.5 g/L to 100 g/L.

* * * * *